(12) United States Patent
Lee (10) Patent No.: US 7,362,629 B2
(45) Date of Patent: Apr. 22, 2008

(54) REDUNDANT CIRCUIT FOR SEMICONDUCTOR MEMORY DEVICE

(75) Inventor: Chang-Hyuk Lee, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 114 days.

(21) Appl. No.: 11/479,243

(22) Filed: Jun. 29, 2006

(65) Prior Publication Data

US 2007/0070735 A1 Mar. 29, 2007

(30) Foreign Application Priority Data

Sep. 29, 2005 (KR) .................. 10-2005-0090943
Dec. 2, 2005 (KR) .................. 10-2005-0117136

(51) Int. Cl.
G11C 29/00 (2006.01)
G11C 7/00 (2006.01)

(52) U.S. Cl. ............... 365/200; 365/208; 365/225.7
(58) Field of Classification Search ............... 365/200, 365/207, 208, 225.7

See application file for complete search history.

(56) References Cited

U.S. PATENT DOCUMENTS

| | | | |
|---|---|---|---|
| 5,889,727 A | 3/1999 | Hsu et al. | |
| 5,907,515 A * | 5/1999 | Hatakeyama | ............... 365/200 |
| 6,615,331 B1 | 9/2003 | Morzano | |
| 6,643,206 B2 | 11/2003 | Shirley | |
| 6,975,548 B2 * | 12/2005 | Tanabe | ............... 365/200 |
| 2003/0221037 A1 | 11/2003 | Van Dyke et al. | |
| 2004/0062110 A1 | 4/2004 | Shirley | |

FOREIGN PATENT DOCUMENTS

| | | |
|---|---|---|
| JP | 4-255998 | 9/1992 |
| JP | 1-016346 | 1/1999 |
| KR | 1994-0016282 | 7/1994 |
| KR | 0145219 | 4/1998 |

* cited by examiner

*Primary Examiner*—VanThu Nguyen
(74) *Attorney, Agent, or Firm*—Blakely, Sokoloff, Taylor & Zafman LLP (57) ABSTRACT

A redundant circuit includes a plurality of bit line sense amp arrays including different local data buses, sharing one bit line sense amp, and being formed adjacently to each other, an input/output fuse unit for outputting a selection signal with different logic state depending on whether or not a first fuse is cut upon activation of a row active operation control signal, a fuse set for providing a redundant signal with different logic state based on whether or not a second fuse is cut and repair addresses upon activation of the row active operation control signal, and a redundant controller for logically operating the selection signal, the redundant signal and a strobe signal to thereby generate a bus control signal to selectively connect the bit line sense amp to the different local data buses.

25 Claims, 7 Drawing Sheets

REDUNDANT CIRCUIT FOR SEMICONDUCTOR MEMORY DEVICE

FIELD OF THE INVENTION

The present invention relates to a redundant circuit for a semiconductor memory device; and more particularly, to a redundant circuit that allows redundant bit line sense amps and fuses to be shared between different local data buses.

DESCRIPTION OF RELATED ARTS

Generally, when there is any defect in one or more of a great number of cells in a semiconductor memory, such a memory is treated as inferior goods since it serves no longer as memory. The probability that defective cells are occurred is high as the degree of integration of memory increases; but, nevertheless, such a way of dealing with these as waste matters is an inefficient process way that lowers a yield.

To improve the yield as mentioned above, there is proposed a redundancy circuit which is utilized to substitute inferior cells by employing spare memory cells previously installed within a memory.

In other words, such a redundancy circuit is a device that compensates a defect by substituting a word line connected to a defective cell with an extra redundancy word line when there raises any defect in a certain cell inside a cell array. To be more specific, when a row address for selecting a defective cell is designated, a row redundancy circuit executes a row redundancy operation by enabling a word line coupled with a repair cell, instead of the defective cell.

Figure 1:
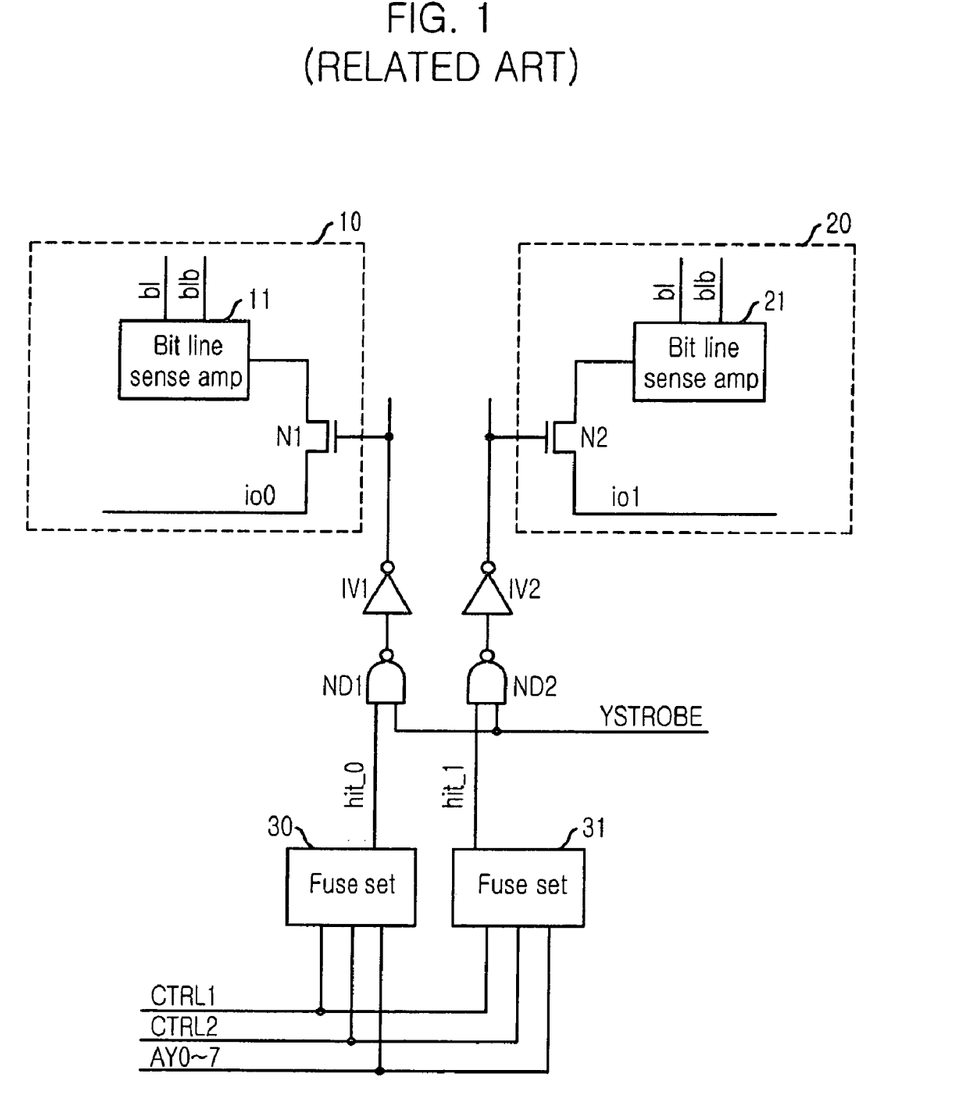
FIG. 1 is a diagram showing a configuration of a redundancy circuit for a semiconductor memory device according to the prior art.

FIG. 1 is a diagram showing a configuration of a redundancy circuit for a semiconductor memory device according to the prior art.

The common redundancy circuit for the semiconductor memory device includes bit line sense amp arrays 10 and 20, inverters IV1 and IV2, NAND gates ND1 and ND2, and fuse sets 30 and 31.

Specifically, the bit line sense amp array 10 is provided with a bit line sense amp 11 connected to bit lines b1 and b1b, and an NMOS transistor N1 for controlling a connection of the bit line sense amp 11 and a local data bus io0 in response to a bus control signal sy_io0. Similarly, the bit line sense amp array 20 is provided with a bit line sense amp 21 connected to bit lines b1 and b1b, and an NMOS transistor N2 for controlling a connection of the bit line sense amp 21 and a local data bus io1 according to a bus control signal sy_io1.

The NAND gate ND1 conducts a NAND operation of a redundant signal hit_0 of the fuse set 30 and a strobe signal YSTROBE. The strobe signal YSTROBE is a pulse signal that is used to perform a strobe operation upon issuance of a read or write command. And the inverter IV1 inverts the output signal of the NAND gate ND1 to provide the bus control signal sy_io0.

Likewise, the NAND gate ND2 NAND-operates a redundant signal hit_1 of the fuse set 31 and the strobe signal YSTROBE. The inverter IV2 inverts the output signal of the NAND gate ND2 to produce the bus control signal sy_io1. And the fuse sets 30 and 31 provide the redundant signals hit_0 and hit_1 depending on control signals CTRL1 and CTRL2 and addresses AY0 to AY7.

Figure 2:
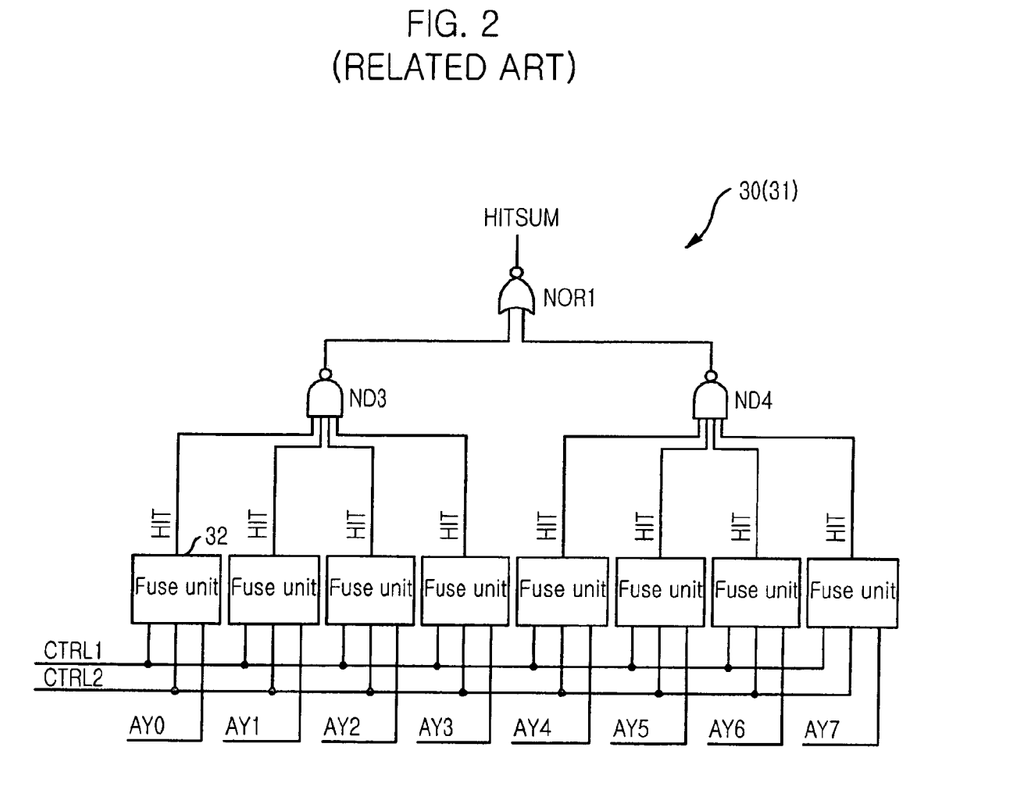
FIG. 2 presents a detailed circuitry diagram of the fuse set depicted in FIG. 1.

FIG. 2 presents a detailed circuitry diagram of the fuse set 30 or 31 depicted in FIG. 1.

The fuse set 30 is provided with a plurality of fuse units 32, NAND gates ND3 and ND4, and a NOR gate NOR1.

Specifically, each of the fuse units 32 outputs a redundant signal HIT in response to the control signals CTRL1 and CTRL2, and each of the addresses AY0 to AY7. Each of the NAND gates ND3 and ND4 performs a NAND operation of the redundant signals HIT provided from the plurality of fuse units 32. The NOR gate NOR1 executes a NOR operation of the outputs of the NAND gates ND3 and ND4 to output a same redundant signal HITSUM as the redundant signals hit_0 and hit_1.

Figure 3:
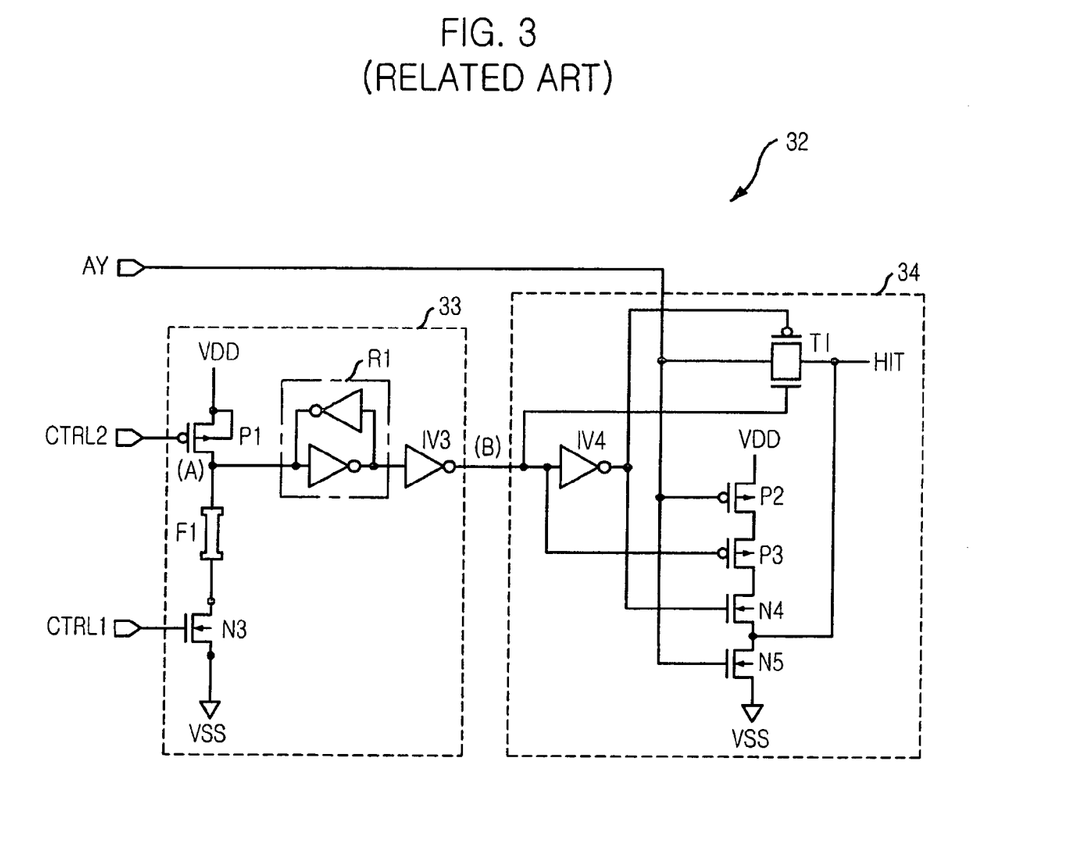
FIG. 3 is a detailed circuitry diagram of each of the fuse unit shown in FIG. 2.

FIG. 3 is a detailed circuitry diagram of each of the fuse units 32 shown in FIG. 2.

Each fuse unit 32 includes a fuse enable section 33 and an address controller 34.

The fuse enable section 33 is provided with a PMOS transistor P1, a fuse F1, an NMOS transistor N3, a latch R1 and an inverter IV3. Specifically, the PMOS transistor P1 is connected between a supply voltage VDD terminal and a node A and gets a control signal CTRL2 via its gate terminal. And the NMOS transistor N3 is coupled between the node A and a ground voltage terminal and takes a control signal CTRL1 via its gate terminal. The latch R1 latches the output of the node A for a preset time. The inverter IV3 inverts the output of the latch R1 to provide an inverted output to a node B.

Meanwhile, the address controller 34 is equipped with an inverter IV4, a transmission gate T1, PMOS transistors P2 and P3, and NMOS transistors N4 and N5.

The transmission gate T1 selectively controls the output of an address AY based on the output of the node B and an output of the inverter IV4 to provide the redundant signal HIT. And the PMOS transistor P2 is connected between the supply voltage VDD terminal and the PMOS transistor P3 and receives the address AY via its gate terminal. The PMOS transistor P3 is connected between the PMOS transistor P2 and the NMOS transistor N4 and gets the output of the node B via its gate terminal.

The NMOS transistor N4 is coupled between the PMOS transistor P3 and the NMOS transistor N5 and takes the output of the inverter IV4 via its gate terminal. And the NMOS transistor N5 is connected between the NMOS transistor N4 and the ground voltage terminal and receives the address AY via its gate terminal. The redundant signal HIT is outputted via a common drain terminal between the NMOS transistors N4 and N5.

Figure 4:
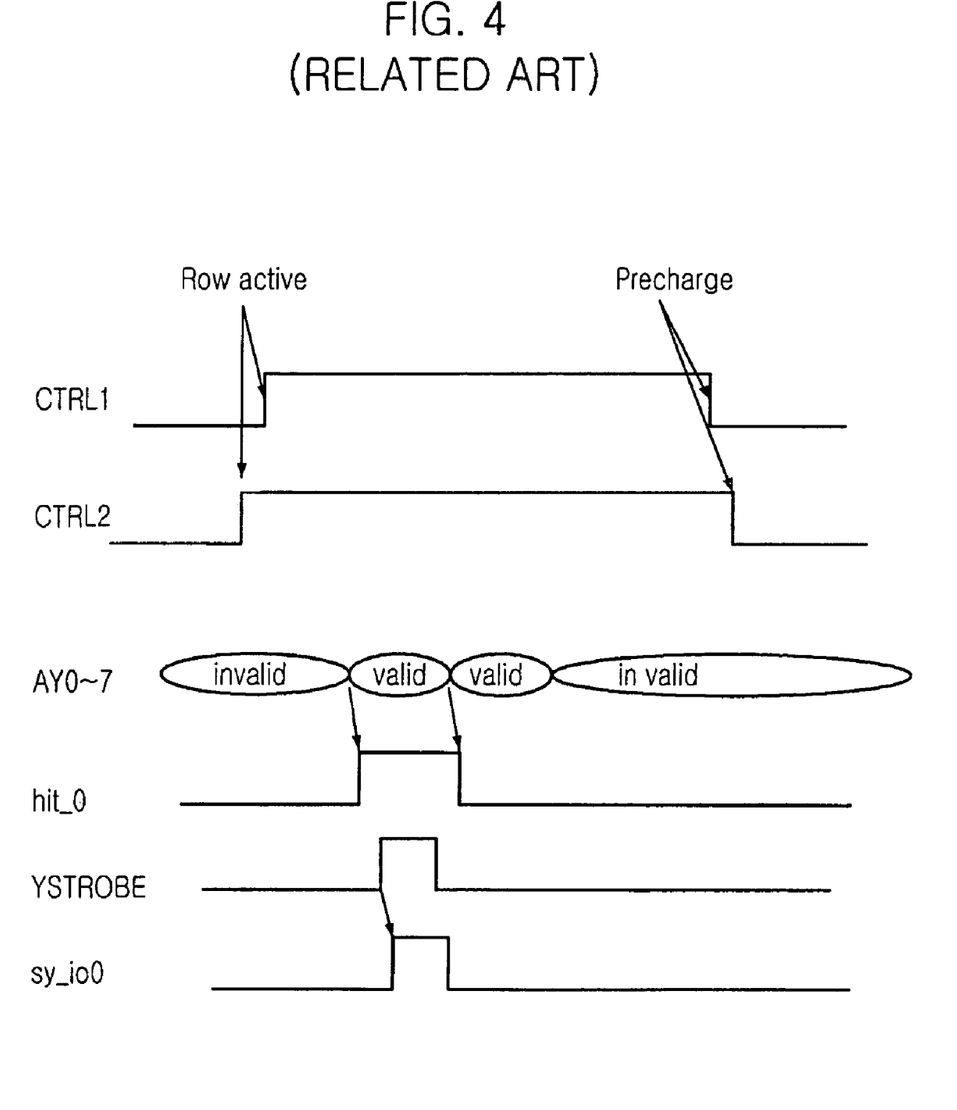
FIG. 4 shows an operational timing diagram of the redundant circuit for the semiconductor memory device according to the prior art.

FIG. 4 shows an operational timing diagram of the redundant circuit for the semiconductor memory device according to the prior art. Especially, FIG. 4 is an operational time diagram showing an instance where the same column addresses AY0 to AY7 as a repair column address are inputted and the fuse set 30 is repaired.

Referring to FIG. 4, the control signals CTRL1 and CTRL2 are signals which are activated to logic high upon row active operation and inactivated to logic low upon precharge operation. Therefore, when the fuse F1 is cut, the address AY is delivered as the redundant signal HIT as it is; and when the fuse F1 is not cut, the address AY is provided as the redundant signal HIT with opposite logic state.

In other words, the fuses F1 of the fuse units 32 corresponding to high bit are cut; and but, the fuses F1 of the fuse units 32 corresponding to low bit are not cut, out of the addresses AY0 to AY7 that are repair column addresses upon column repair. Thereafter, when the same column addresses as the repair column addresses are inputted, outputs of the fuse units 32 become all logic high, thereby providing the redundant signal HITSUM of logic high.

Therefore, if the redundant signal hit_0 is activated during a valid interval of the addresses AY0 to AY7 upon row active operation, the strobe signal YSTROBE is activated and the bus control signal sy_io0 is activated. Thus, in response to the bus control signal sy_io0, the NMOS transistor N1 is turned on, thereby establishing a connection of the bit line sense amp 11 and the local data bus io0.

In the common redundant circuit for the semiconductor memory device as structured above, however, the different local data buses io_0 and io_1 are separately located at the different bit line sense amp arrays 10 and 20, respectively. Further, it has the structure that the bus control signals sy_io0 and sy_io1 connecting the redundant bit line sense amps 11 and 21 are outputted from the two independent fuse sets 30 and 31, respectively. As a result, the conventional semiconductor memory device increases its layout area due to the fuse sets 30 and 31.

SUMMARY OF THE INVENTION

It is, therefore, a primary object of the present invention to provide a redundant circuit capable of decreasing a layout area owing to a reduction of a fuse set by sharing redundant bit line sense amps and fuses between different local data buses.

In accordance with the present invention, there is provided a redundant circuit for a semiconductor memory device, including: a plurality of bit line sense amp arrays including different local data buses, sharing one bit line sense amp, and being formed adjacently to each other; an input/output fuse unit for outputting a selection signal with different logic state depending on whether or not a first fuse is cut upon activation of a row active operation control signal; a fuse set for providing a redundant signal with different logic state based on whether or not a second fuse is cut and repair addresses upon activation of the row active operation control signal; and a redundant controller for logically operating the selection signal, the redundant signal and a strobe signal to thereby generate a bus control signal to selectively connect the bit line sense amp to the different local data buses.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be set forth in detail with reference to the accompanying drawings.

Figure 5:
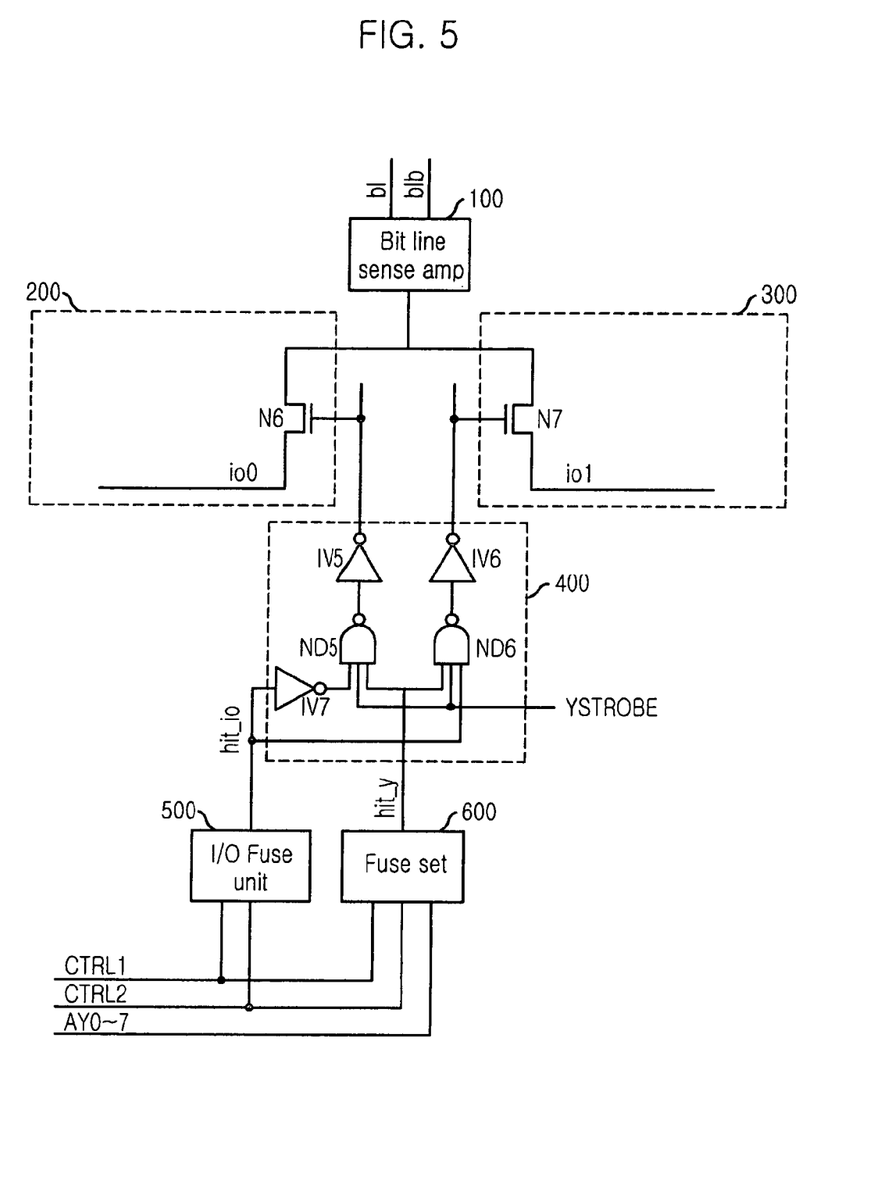
FIG. 5 is a circuitry diagram showing a configuration of a redundant circuit for a semiconductor memory device in accordance with the present invention.

FIG. 5 illustrates a circuitry diagram of a redundant circuit for a semiconductor memory device in accordance with the present invention.

The redundant circuit of the invention comprises a single bit line sense amp 100, different bit line sense amp arrays 200 and 300, a redundant controller 400, an input/output fuse unit 500, and a fuse set 600.

Specifically, the bit line sense amp 100 is connected between bit lines b1 and b1b and NMOS transistors N6 and N7 and shared between the two different bit line sense amp arrays 200 and 300. This bit line sense amp array 200 is provided with an NMOS transistor N6 for controlling a connection of the bit line sense amp 100 and a local data bus io0 in response to a bus control signal sy_io0. Similarly, the bit line sense amp array 300 is provided with an NMOS transistor N7 for controlling a connection of the bit line sense amp 100 and a local data bus io1 in response to a bus control signal sy_io1.

The redundant controller 400 includes inverters IV5 to IV7 and NAND gates ND5 and ND6.

First of all, the NAND gate ND5 performs an NAND operation of a selection signal hit_io inverted by the inverter IV7, a strobe signal YSTROBE and a redundant signal hit_y. The NAND gate ND6 NAND-operates the selection signal hit_io, the strobe signal YSTROBE and the redundant signal hit_y. The inverter IV5 inverts the output of the NAND gate ND5 to produce the bus control signal sy_io0. And the inverter IV6 inverts the output of the NAND gate ND6 to provide the bus control signal sy_io1. The strobe signal YSTROBE is a pulse signal used to conduct a strobe operation upon issuance of a read or write command.

The input/output fuse unit 500 provides the selection signal hit_io depending on control signals CTRL1 and CTRL2. And the fuse set 600 outputs the redundant signal hit_y based on the control signals CTRL1 and CTRL2 and addresses AY0 to AY7.

A detailed configuration of the fuse set 600 is the same as that of FIGS. 2 and 3; and therefore, a detailed description thereof is omitted here wherein its constructional elements are given the same reference numerals.

Figure 6:
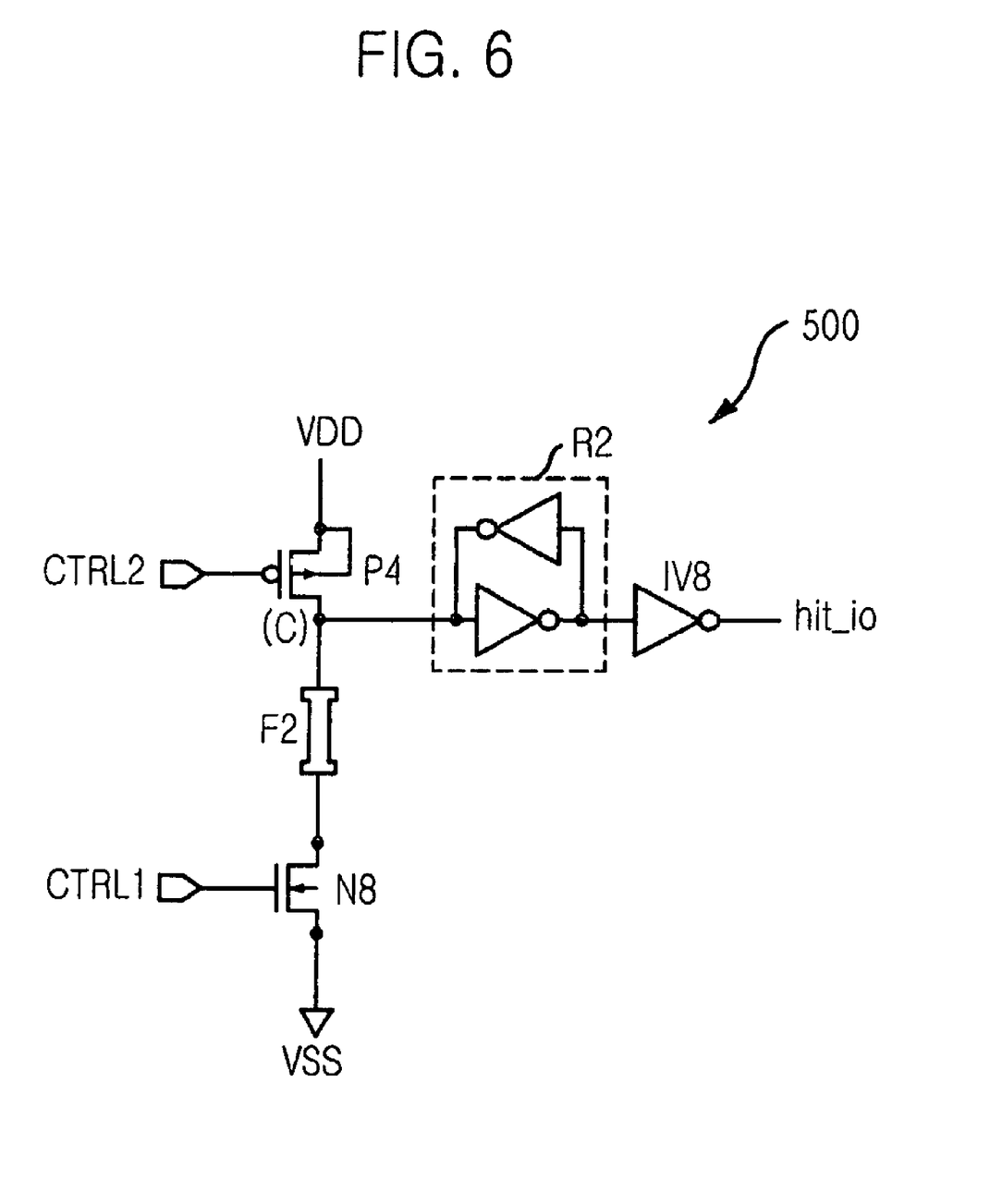
FIG. 6 illustrates a detailed circuitry diagram of the input/output fuse unit shown in FIG. 5.

FIG. 6 illustrates a detailed circuitry diagram of the input/output fuse unit 500 shown in FIG. 5.

The input/output fuse unit 500 is provided with a PMOS transistor P4, a fuse F2, an NMOS transistor N8, a latch R2 and an inverter IV8. Specifically, the PMOS transistor P4 is connected between a supply voltage VDD terminal and a node C and takes the control signal CTRL2 via its gate port. The NMOS transistor N8 is coupled between the node C and a ground voltage terminal and gets the control signal CTRL1 via its gate terminal. The latch R1 latches the output of the node C for a preset time. And the inverter IV8 inverts the output of the latch R2 to output the selection signal hit_io.

Now, an operational procedure of the invention as configured above will be described below in detail referring to an operational timing chart shown in FIG. 7.

First, the control signals CTRL1 and CTRL2 are signals which are activated to logic high upon row active operation and inactivated to logic low upon precharge operation. Therefore, the input/output fuse unit 500 outputs the selection signal hit_io of logic high when the fuse F2 is cut at the row active interval, and of logic low when the fuse F2 is not cut.

Further, the fuse set 600 cuts the fuses F1 of the fuse units 32 corresponding to high bit but doesn't cut the fuses F1 of the fuse units 32 corresponding to low bit, among the addresses AY0 to AY7 that are repair column addresses upon the column repair. Thereafter, when the same column addresses as the repair column addresses are inputted, outputs of the fuse units 32 are all logic high, thereby issuing the redundant signal hit_y of logic high.

Therefore, if the fuse F2 is not cut upon the row active operation, the selection signal hit_io becomes logic low. And if the redundant signal hit_y is activated during a valid interval of the addresses AY0 to AY7 upon the fuse repair operation, the strobe signal YSTROBE is activated and the bus control signal sy_io0 is activated. Thus, in response to the bus control signal sy_io0, the NMOS transistor N6 is turned on, thereby connecting the bit line sense amp 100 to the local data bus io0.

Namely, when it wants to substitute the bit line on the local data bus io0 side, the invention doesn't cut the fuse F2 of the input/output fuse unit 500, while when it wants to substitute the bit line on the local data bus io1 side, the invention cuts the fuse F2 of the input/output fuse unit 500.

Figure 7:
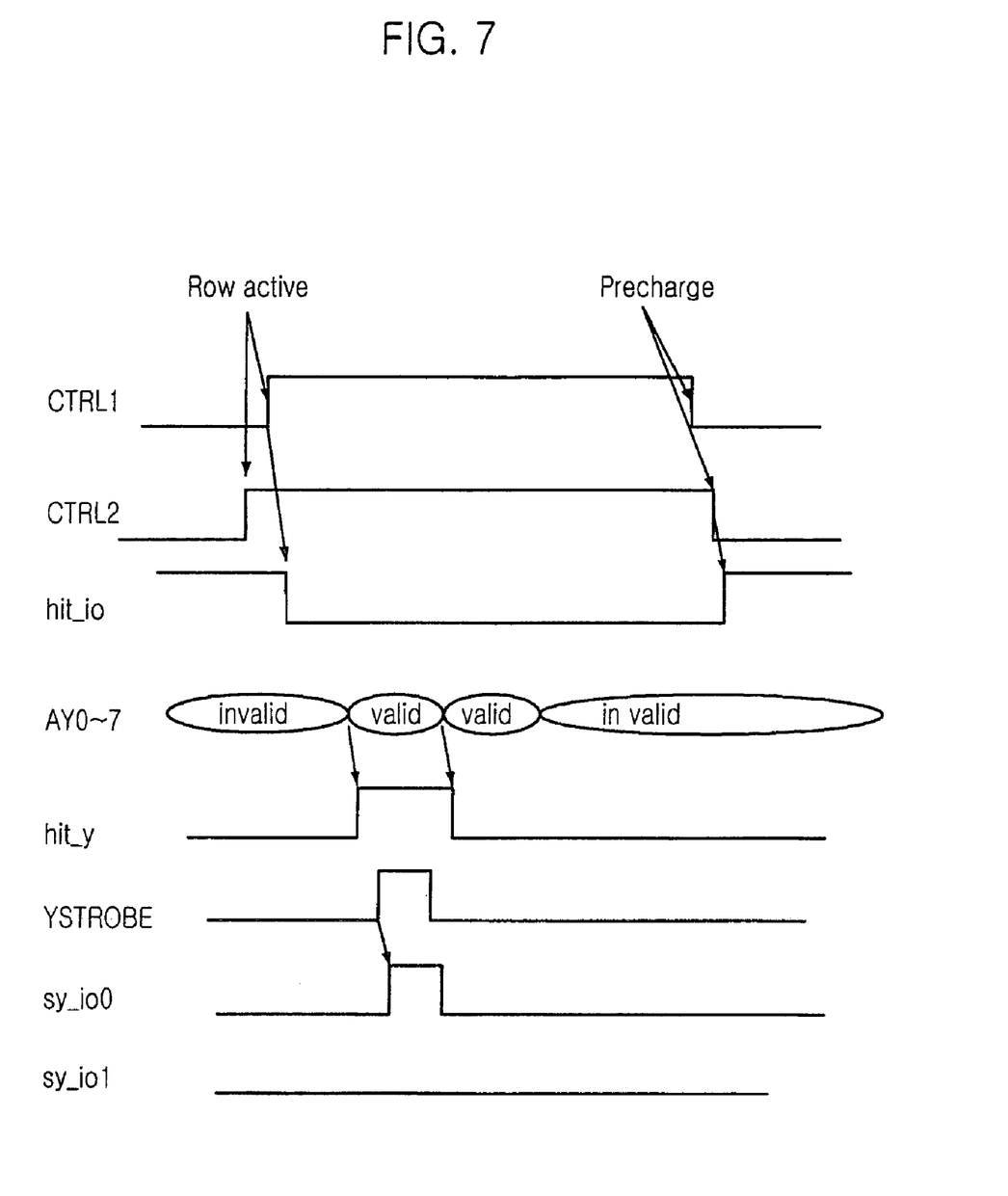
FIG. 7 shows an operational timing diagram of the redundant circuit for the semiconductor memory device in accordance with the present invention.

Therefore, as shown in the timing chart of FIG. 7, it can be seen that when the invention doesn't cut the fuse F2 of the input/output fuse unit 500 to substitute the bit line on the local data bus io0 side, the bus control signal sy_io0 is enabled and the bus control signal sy_io1 is disabled. Conversely, it can be seen that when the invention cuts the fuse F2 of the input/output fuse unit 500, the bus control signal sy_io1 is enabled and the bus control signal sy_io0 is disabled.

The invention as described above can reduce the number of the fuse set 600 and the bit line sense amp 100 by a half compared to the prior art and allows each of the bit line sense amps 200 and 300 on which the different local data buses io0 and io1 are located to operationally share the fuse set 600 and bit line sense amp 100 half-reduced. For the above purpose, the input/output fuse unit 500 and the redundant controller 400 are additionally included.

Meanwhile, even though the invention is explained with respect to the configuration of one input/output fuse unit 500, one fuse set 600 and one bit line sense amp 100 as the preferred embodiment, the invention is not limited thereto but may include one input/output fuse unit 500 and a plurality of fuse sets 600, or include two redundant column signals per one fuse set 600.

As described above, the present invention can twice expand column area capable of substituting with one fuse unit and also reduce the number of the fuse set and the bit line sense amp by a half compared the prior art. As a result, the invention can reduce the whole chip size and save the manufacturing cost.

The present application contains subject matter related to Korean patent application No. 2005-90942 and No. 2005-117136, filed with the Korean Intellectual Property Office on Sep. 29, 2005, and on Dec. 02, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A redundant circuit for a semiconductor memory device, comprising:
   a plurality of bit line sense amp arrays including different local data buses, sharing one bit line sense amp, and being formed adjacently to each other;
   an input/output fuse unit for outputting a selection signal with different logic state depending on whether or not a first fuse is cut upon activation of a row active operation control signal;
   a fuse set for providing a redundant signal with different logic state based on whether or not a second fuse is cut and repair addresses upon activation of the row active operation control signal; and
   a redundant controller for logically operating the selection signal, the redundant signal and a strobe signal to thereby generate a bus control signal to selectively connect the bit line sense amp to the different local data buses.

2. The redundant circuit as recited in claim 1, wherein the row active operation control signal is activated to logic high upon row active operation and inactivated to logic low upon precharge operation.

3. The redundant circuit as recited in claim 1, wherein the strobe signal is a pulse signal for executing a strobe operation upon issuance of a read or write command.

4. The redundant circuit as recited in claim 1, wherein the input/output fuse unit outputs the selection signal of logic high when the first fuse is cut and of logic high when the first fuse is not cut, at a row active interval.

5. The redundant circuit as recited in claim 1, wherein the fuse set includes a plurality of fuse units; and cuts fuses of fuse units corresponding to high bit, and doesn't cut fuses of fuse units corresponding to low bit, out of the repair addresses, upon column repair.

6. The redundant circuit as recited in claim 1, wherein the input/output fuse unit doesn't cut the first fuse in case of substituting a bit line on a first local data bus side, and cuts the first fuse in case of substituting a bit line on a second local data bus side.

7. The redundant circuit as recited in claim 1, wherein the input/output fuse unit includes:
   a first driving element connected between the first fuse and a ground voltage terminal for receiving a first row active operation control signal via a gate terminal;
   a second driving element coupled between the first fuse and a supply voltage terminal for taking a second row active operation control signal via a gate terminal;
   a latch for latching the output of the first fuse; and
   a first inverter for inverting the output of the latch to provide the selection signal.

8. The redundant circuit as recited in claim 1, wherein the redundant controller includes:
   a first NAND gate for performing an NAND operation of the inverted selection signal, the redundant signal, and the strobe signal;
   a second NAND gate for conducting an NAND operation of the selection signal, the redundant signal, and the strobe signal;
   a second inverter for inverting the output of the first NAND gate to output a first bus control signal; and
   a third inverter for inverting the output of the second NAND gate to provide a second bus control signal.

9. The redundant circuit as recited in claim 1, wherein each of the plurality of bit line sense amp arrays includes a multiplicity of switching elements for selectively connecting the one bit line sense amp to the different local data buses in response to the bus control signal.

10. The redundant circuit as recited in claim 1, wherein the fuse set enables the redundant signal when the repair address consistent with the cutting state of the second fuse is inputted and disables the redundant signal when the repair address is changed.

11. The redundant circuit as recited in claim 1, wherein the redundant controller activates a first bus control signal when the selection signal and redundant signal are enabled and activates a second bus control signal when the selection signal is disabled and the redundant signal is enabled.

12. The redundant circuit as recited in claim 11, wherein the first and the second bus control signals are selectively connected to the different local data buses depending on their own signals.

13. A redundant circuit for use in a semiconductor memory device, comprising:
  a plurality of bit line sense amplifier arrays including different local data buses, sharing one bit line sense amplifier, and being formed adjacently to each other;
  a fuse unit for outputting a selection signal and a redundant signal on activation of a row active operation control signal; and
  a redundant controller for logically operating the selection signal, the redundant signal, and a strobe signal to thereby generate a bus control signal to selectively connect the bit line sense amplifier to the different local data buses.

14. The redundant circuit as recited in claim 13, wherein the fuse unit includes:
  a input/output fuse unit for outputting the selection signal with different logic state depending on whether or not a first fuse is cut upon activation of a row active operation control signal; and
  a fuse set for providing a redundant signal with different logic state based on whether or not a second fuse is cut and repair addresses upon activation of the row active operation control signal.

15. The redundant circuit as recited in claim 14, wherein the row active operation control signal is activated to logic high upon row active operation and inactivated to logic low upon precharge operation.

16. The redundant circuit as recited in claim 14, wherein the strobe signal is a pulse signal for executing a strobe operation upon issuance of a read or write command.

17. The redundant circuit as recited in claim 14, wherein the input/output fuse unit outputs the selection signal of logic high when the first fuse is cut and of logic high when the first fuse is not cut, at a row active interval.

18. The redundant circuit as recited in claim 14, wherein the fuse set includes a plurality of fuse units; and cuts fuses of fuse units corresponding to high bit, and doesn't cut fuses of fuse units corresponding to low bit, out of the repair addresses, upon column repair.

19. The redundant circuit as recited in claim 14, wherein the input/output fuse unit doesn't cut the first fuse in case of substituting a bit line on a first local data bus side, and cuts the first fuse in case of substituting a bit line on a second local data bus side.

20. The redundant circuit as recited in claim 14, wherein the input/output fuse unit includes:
  a first driving element connected between the first fuse and a ground voltage terminal for receiving a first row active operation control signal via a gate terminal;
  a second driving element coupled between the first fuse and a supply voltage terminal for taking a second row active operation control signal via a gate terminal;
  a latch for latching the output of the first fuse; and
  a first inverter for inverting the output of the latch to provide the selection signal.

21. The redundant circuit as recited in claim 14, wherein the redundant controller includes:
  a first NAND gate for performing an NAND operation of the inverted selection signal, the redundant signal, and the strobe signal;
  a second NAND gate for conducting an NAND operation of the selection signal, the redundant signal, and the strobe signal;
  a second inverter for inverting the output of the first NAND gate to output a first bus control signal; and
  a third inverter for inverting the output of the second NAND gate to provide a second bus control signal.

22. The redundant circuit as recited in claim 14, wherein each of the plurality of bit line sense amplifier arrays includes a multiplicity of switching elements for selectively connecting the one bit line sense amplifier to the different local data buses in response to the bus control signal.

23. The redundant circuit as recited in claim 14, wherein the fuse set enables the redundant signal when the repair address consistent with the cutting state of the second fuse is inputted and disables the redundant signal when the repair address is changed.

24. The redundant circuit as recited in claim 14, wherein the redundant controller activates a first bus control signal when the selection signal and redundant signal are enabled and activates a second bus control signal when the selection signal is disabled and the redundant signal is enabled.

25. The redundant circuit as recited in claim 24, wherein the first and the second bus control signals are selectively connected to the different local data buses depending on their own signals.

* * * * *